US010978897B2

(12) United States Patent
Tran

(10) Patent No.: US 10,978,897 B2
(45) Date of Patent: Apr. 13, 2021

(54) SYSTEMS AND METHODS FOR SUPPRESSING UNDESIRABLE VOLTAGE SUPPLY ARTIFACTS

(71) Applicant: Allegro MicroSystems, LLC, Manchester, NH (US)

(72) Inventor: Sam Tran, Lee, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 561 days.

(21) Appl. No.: 15/942,968

(22) Filed: Apr. 2, 2018

(65) Prior Publication Data

US 2019/0305565 A1  Oct. 3, 2019

(51) Int. Cl.
*H02J 7/00* (2006.01)

(52) U.S. Cl.
CPC .............. *H02J 7/008* (2013.01); *H02J 7/007* (2013.01); *H02J 7/0029* (2013.01)

(58) Field of Classification Search
None
See application file for complete search history.

(56) References Cited

U.S. PATENT DOCUMENTS

| | | | |
|---|---|---|---|
| 4,409,608 A | 10/1983 | Yoder | |
| 4,451,845 A | 5/1984 | Philofsky et al. | |
| 4,994,731 A | 2/1991 | Sanner | |
| 5,244,834 A | 9/1993 | Suzuki et al. | |
| 5,399,905 A | 3/1995 | Honda et al. | |
| 5,414,355 A | 5/1995 | Davidson et al. | |
| 5,523,617 A | 6/1996 | Asanasavest | |
| 5,539,241 A | 7/1996 | Abidi et al. | |
| 5,563,199 A | 10/1996 | Harada et al. | |
| 5,579,194 A | 11/1996 | Mackenzie et al. | |
| 5,581,179 A | 12/1996 | Engel et al. | |
| 5,648,682 A | 7/1997 | Nakazawa et al. | |
| 5,666,004 A | 9/1997 | Bhattacharyya et al. | |
| 5,691,869 A | 11/1997 | Engel et al. | |
| 5,714,405 A | 2/1998 | Tsubosaki et al. | |

(Continued)

FOREIGN PATENT DOCUMENTS

| DE | 4031560 | 4/1992 |
|---|---|---|
| JP | H01-207909 | 8/1989 |

(Continued)

OTHER PUBLICATIONS

Response to Office Action and Request for Examination (RCE) filed Apr. 19, 2019 for U.S. Appl. No. 15/269,097; 17 pages.

(Continued)

*Primary Examiner* — David V Henze-Gongola
(74) *Attorney, Agent, or Firm* — Daly, Crowley, Mofford & Durkee, LLP

(57) ABSTRACT

Systems and methods described herein provide a sensor integrated circuit (IC) having a high voltage bi-directional current source and disconnect switch that are configured to suppress undesirable voltage artifacts. The sensor IC can include a power pin for coupling to an external power supply, a reference pin, and a functional circuit. The bi-directional current source can be disposed in a current path between the power pin and an energy storage device and be configured to control a current flow to the energy storage device and a current flow from the energy storage device.

10 Claims, 10 Drawing Sheets

(56) References Cited

U.S. PATENT DOCUMENTS

| | | |
|---|---|---|
| 5,726,577 A | 3/1998 | Engel et al. |
| 5,729,130 A | 3/1998 | Moody et al. |
| 5,804,880 A | 9/1998 | Mathew |
| 5,822,849 A | 10/1998 | Casali et al. |
| 5,912,556 A | 6/1999 | Frazee et al. |
| 5,940,256 A | 8/1999 | MacKenzie et al. |
| 5,973,388 A | 10/1999 | Chew et al. |
| 6,057,997 A | 5/2000 | Mackenzie et al. |
| 6,097,109 A | 8/2000 | Fendt et al. |
| 6,178,514 B1 | 1/2001 | Wood |
| 6,256,865 B1 | 7/2001 | Engel et al. |
| 6,316,736 B1 | 11/2001 | Jairazbhoy et al. |
| 6,359,331 B1 | 3/2002 | Rinehart et al. |
| 6,396,712 B1 | 5/2002 | Kuijk |
| 6,420,779 B1 | 7/2002 | Sharma et al. |
| 6,424,018 B1 | 7/2002 | Ohtsuka |
| 6,429,652 B1 | 8/2002 | Allen et al. |
| 6,480,699 B1 | 11/2002 | Lovoi |
| 6,486,535 B2 | 11/2002 | Liu |
| 6,501,270 B1 | 12/2002 | Opie |
| 6,504,366 B2 | 1/2003 | Bodin et al. |
| 6,563,199 B2 | 5/2003 | Yasunaga et al. |
| 6,608,375 B2 | 8/2003 | Terui et al. |
| 6,610,923 B1 | 8/2003 | Nagashima et al. |
| 6,617,846 B2 | 9/2003 | Hayat-Dawoodi et al. |
| 6,642,609 B1 | 11/2003 | Minamio et al. |
| 6,696,952 B2 | 2/2004 | Zirbes |
| 6,713,836 B2 | 3/2004 | Liu et al. |
| 6,737,298 B2 | 5/2004 | Shim et al. |
| 6,747,300 B2 | 6/2004 | Nadd et al. |
| 6,775,140 B2 | 8/2004 | Shim et al. |
| 6,781,359 B2 | 8/2004 | Stauth et al. |
| 6,798,057 B2 | 9/2004 | Bolkin et al. |
| 6,809,416 B1 | 10/2004 | Sharma |
| 6,812,687 B1 | 11/2004 | Ohtsuka |
| 6,825,067 B2 | 11/2004 | Ararao et al. |
| 6,832,420 B2 | 12/2004 | Liu |
| 6,853,178 B2 | 2/2005 | Hayat-Dawoodi |
| 6,861,283 B2 | 3/2005 | Sharma |
| 6,875,634 B2 | 4/2005 | Shim et al. |
| 6,903,447 B2 | 6/2005 | Schmitz et al. |
| 6,921,955 B2 | 7/2005 | Goto |
| 6,960,493 B2 | 11/2005 | Ararao et al. |
| 6,974,909 B2 | 12/2005 | Tanaka et al. |
| 6,995,315 B2 | 2/2006 | Sharma et al. |
| 7,005,325 B2 | 2/2006 | Chow et al. |
| 7,026,808 B2 | 4/2006 | Vig et al. |
| 7,075,287 B1 | 7/2006 | Mangtani et al. |
| 7,166,807 B2 | 1/2007 | Gagnon et al. |
| 7,259,624 B2 | 8/2007 | Barnett |
| 7,265,531 B2 | 9/2007 | Stauth et al. |
| 7,304,370 B2 | 12/2007 | Imaizumi et al. |
| 7,358,724 B2 | 4/2008 | Taylor et al. |
| 7,378,721 B2 | 5/2008 | Frazee et al. |
| 7,378,733 B1 | 5/2008 | Hoang et al. |
| 7,476,816 B2 | 1/2009 | Doogue et al. |
| 7,476,953 B2 | 1/2009 | Taylor et al. |
| 7,518,493 B2 | 4/2009 | Bryzek et al. |
| 7,573,112 B2 | 8/2009 | Taylor |
| 7,676,914 B2 | 3/2010 | Taylor |
| 7,687,882 B2 | 3/2010 | Taylor et al. |
| 7,696,006 B1 | 4/2010 | Hoang et al. |
| 7,768,083 B2 | 8/2010 | Doogue et al. |
| 7,777,607 B2 | 8/2010 | Taylor et al. |
| 8,008,908 B2 | 8/2011 | Doogue et al. |
| 8,093,670 B2 | 1/2012 | Taylor |
| 8,222,888 B2 | 7/2012 | David et al. |
| 9,228,860 B2 | 1/2016 | Sharma et al. |
| 9,411,025 B2 | 8/2016 | David et al. |
| 9,494,660 B2 | 11/2016 | David et al. |
| 2001/0052780 A1 | 12/2001 | Hayat-Dawoodi |
| 2002/0005780 A1 | 1/2002 | Ehrlich et al. |
| 2002/0027488 A1 | 3/2002 | Hayat-Dawoodi et al. |
| 2002/0195693 A1 | 12/2002 | Liu et al. |
| 2003/0038464 A1 | 2/2003 | Furui |
| 2003/0209784 A1 | 11/2003 | Schmitz et al. |
| 2004/0094826 A1 | 5/2004 | Yang et al. |
| 2004/0135220 A1 | 7/2004 | Goto |
| 2004/0135574 A1 | 7/2004 | Hagio et al. |
| 2004/0174655 A1 | 9/2004 | Tsai et al. |
| 2004/0207035 A1 | 10/2004 | Witcraft et al. |
| 2004/0207077 A1 | 10/2004 | Leal et al. |
| 2004/0207400 A1 | 10/2004 | Witcraft et al. |
| 2004/0262718 A1 | 12/2004 | Ramakrishna |
| 2005/0035448 A1 | 2/2005 | Hsu et al. |
| 2005/0151448 A1 | 7/2005 | Hikida et al. |
| 2005/0173783 A1 | 8/2005 | Chow et al. |
| 2005/0219796 A1 | 10/2005 | Narendra et al. |
| 2005/0224248 A1 | 10/2005 | Gagnon et al. |
| 2005/0248005 A1 | 11/2005 | Hayat-Dawoodi |
| 2005/0253507 A1 | 11/2005 | Fujimura et al. |
| 2005/0270748 A1 | 12/2005 | Hsu |
| 2005/0274982 A1 | 12/2005 | Ueda et al. |
| 2006/0038289 A1 | 2/2006 | Hsu et al. |
| 2006/0077598 A1 | 4/2006 | Taylor et al. |
| 2006/0175674 A1 | 8/2006 | Taylor et al. |
| 2006/0181263 A1 | 8/2006 | Doogue et al. |
| 2006/0219436 A1 | 10/2006 | Taylor et al. |
| 2006/0267135 A1 | 11/2006 | Wolfgang et al. |
| 2007/0007631 A1 | 1/2007 | Knittl |
| 2007/0018642 A1 | 1/2007 | Ao |
| 2007/0138651 A1 | 6/2007 | Hauenstein |
| 2007/0170533 A1 | 7/2007 | Doogue et al. |
| 2007/0241423 A1 | 10/2007 | Taylor et al. |
| 2008/0013298 A1 | 1/2008 | Sharma et al. |
| 2008/0018261 A1 | 1/2008 | Kastner |
| 2008/0034582 A1 | 2/2008 | Taylor |
| 2008/0036453 A1 | 2/2008 | Taylor |
| 2010/0019332 A1 | 1/2010 | Taylor |
| 2010/0052052 A1 | 3/2010 | Lotfi et al. |
| 2010/0052125 A1 | 3/2010 | Sasaki et al. |
| 2010/0052424 A1 | 3/2010 | Taylor et al. |
| 2010/0060244 A1* | 3/2010 | Kurokawa ............ H02J 7/0029 320/166 |
| 2013/0106174 A1 | 5/2013 | Uchida |
| 2013/0176012 A1 | 7/2013 | Eagen et al. |
| 2013/0249027 A1 | 9/2013 | Taylor et al. |
| 2013/0249029 A1 | 9/2013 | Vig et al. |
| 2013/0249544 A1 | 9/2013 | Vig et al. |
| 2015/0200162 A1 | 7/2015 | Constantino et al. |
| 2015/0285874 A1 | 10/2015 | Taylor et al. |
| 2016/0285255 A1* | 9/2016 | O'Donnell ............ H02H 9/046 |
| 2017/0117801 A1 | 4/2017 | Shoemaker et al. |
| 2018/0175641 A1* | 6/2018 | Oikarinen ............... H01M 2/34 |

FOREIGN PATENT DOCUMENTS

| | | |
|---|---|---|
| JP | H09-79865 | 3/1997 |
| JP | H11-326354 | 11/1999 |
| JP | 2000-14047 | 1/2000 |
| JP | 2000-260939 | 9/2000 |
| TW | 535274 | 6/2003 |
| WO | WO 00/13438 | 3/2000 |
| WO | WO 00/54068 | 9/2000 |
| WO | WO 00/69045 | 11/2000 |
| WO | WO 01/74139 | 10/2001 |
| WO | WO 2005/013363 | 2/2005 |
| WO | WO 2007/120697 | 10/2007 |

OTHER PUBLICATIONS

U.S. Non-Final Office Action dated Jul. 30, 2018 for U.S. Appl. No. 15/269,097; 28 Pages.

U.S. Non-Final Office Action dated Oct. 19, 2010 for U.S. Appl. No. 12/198,191; 12 Pages, Amendment dated Feb. 18, 2011 for U.S. Appl. No. 12/198,191; 26 Pages.

U.S. Final Office Action dated Mar. 17, 2011 for U.S. Appl. No. 12/198,191; 14 Pages.

Notice of Appeal dated Aug. 15, 2011 for U.S. Appl. No. 12/198,191; 1 Page.

Appeal Brief dated Oct. 28, 2011 for U.S. Appl. No. 12/198,191; 17 Pages.

(56) References Cited

OTHER PUBLICATIONS

Examiner's Answer to Appeal Brief dated Dec. 19, 2011 for U.S. Appl. No. 12/198,191; 17 Pages.
Reply Brief Filed Jan. 9, 2012 for U.S. Appl. No. 12/198,191; 14 Pages.
Decision on Appeal dated Sep. 22, 2014 for U.S. Appl. No. 12/198,191; 6 Pages.
Invitation to Pay Additional Fees and Partial Search Report dated Jan. 11, 2010 for PCT Application No. PCT/US2009/054254; 8 Pages.
International Search Report and Written Opinion dated Jun. 2, 2010 for PCT Application No. PCT/US2009/054254; 24 Pages.
International Preliminary Report on Patentability dated Mar. 10, 2011 for PCT Application No. PCT/US2009/054254; 14 Pages.
English Translation of Japanese Office Action dated Jan. 4, 2013 for Japanese Application No. JP 2011-525094; 3 Pages.
Response to Japanese Office Action filed Apr. 25, 2013 for Japanese Application No. JP 2011-525094; 6 Pages.
Japanese Notice of Allowance and Letter from Yuasa & Hara dated Feb. 5, 2014 for Japanese Application No. JP 2011-525094; 4 Pages.
Chinese Office Action with English Translation dated Oct. 29, 2012 for Chinese Application No. CN 200980133460.9; 22 Pages.
Response to Chinese Office Action dated Mar. 13, 2013 for Chinese Application No. CN 200980133460.9; 9 Pages.
Chinese Office Action with English Translation dated Jul. 8, 2013 for Chinese Application No. CN 200980133460.9; 12 Pages.
Response to Chinese Office Action dated Jul. 8, 2013 for Chinese Application No. CN 200980133460.9; Response Filed Sep. 23, 2013; 4 Pages.
Chinese Notice of Allowance with English Translation dated Jan. 27, 2014 for Chinese Application No. CN 200980133460.9; 4 Pages.
Infineon Technologies Datasheet TLE4942-1, TLE4942-1C; Differential Two-Wire Hall Effect Sensor-IC for Wheel Speed Applications with Direct Detection; vol. 3.1. Feb. 2005; 32 Pages.
Infineon Technologies Datasheet TLE4980C; Smart Hall Effect Sensor for Camshaft Applications. Infineon Technologies AG; Germany; 2 Pages.
Allegro Datasheet ATS616LSG; Dynamic Self-Calibrating Peak-Detecting Differential Hall Effect Gear Tooth Sensor. 2005; 14 Pages.
Allegro Datasheet ATS616LSG Dynamic Self-Calibrating Peak-Detecting Differential Hall Effect Gear Tooth Sensor, Mar. 22, 2006, 2 pages.
Allegro Microsystems, Inc., Hall-Effect IC Applications Guide; 36 Pages; undated.
Allegro Datasheet A1642LK; Two-Wire True Zero-Speed Miniature Differential Peak-Detecting Sensor with Continuous Calibration; Jan. 2005; 13 Pages.
Allegro Microsystems, Inc; Two-Wire True Zero-Speed Miniature Differential Peak-Detecting Sensor with Continuous Calibration; Data Sheet; Mar. 22, 2006. 2 Pages.
Motz et al.; A Chopped Hall Sensor with Small Jitter and Programmable "True Power-On" Function. IEEE Journal of Solid-State Circuits; vol. 40, No. 7; Jul. 2005. 8 Pages.
Scandius Biomedical; TriTis Tibial Fixation System and Implant. Brochure from Scandius Biomedical, Inc. Website http://www.scandius.com/documents/TriTisSSheetPlum3.pdf; Jan. 1, 2006. 2 Pages.
Hashemi; The Close Attached Capacitor: A Solution to Switching Noise Problems; IEEE Transactions on Components, Hybrids, and Manufacturing Technology, IEEE Inc. New York, US; 15(6); Dec. 1992; p. 7056-63. XP000364765. ISSN: 8 pages.
Wibben et al.; A High Efficiency DC-DC Converter Using 2 nH Integrated Inductors; IEEE Journal of Solid State Circuits, IEEE Service Center, Piscataway, NJ. 43(4); Apr. 1, 2008; p. 844-54. XP011206706, ISSN: 11 pages.
International Search Report and Written Opinion dated Oct. 23, 2007 for PCT Application No. PCT/US2007/008920; 12 Pages.
Second and Supplementary Notice Informing the Applicant of the Communication of the International Application dated Aug. 14, 2008 for PCT Application No. PCT/US2007/008920; 1 page.
Notification Concerning Transmittal of International Preliminary Report on Patentability dated Oct. 23, 2008 for PCT Application No. PCT/US2007/008920; 7 pages.
Notification Concerning Transmittal of International Preliminary Report on Patentability dated Jan. 22, 2009 for PCT Application No. PCT/US2007/013358; 7 pages.
International Search Report and Written Opinion dated Feb. 28, 2008 for PCT Application No. PCT/US2007/013358; 13 Pages.
U.S. Appl. No. 11/554,619.
U.S. Appl. No. 11/877,144.
U.S. Appl. No. 11/877,100.
U.S. Appl. No. 12/178,781.
U.S. Appl. No. 11/279,780.
Notice of Allowance dated Jun. 26, 2019 for U.S. Appl. No. 15/269,097; 16 Pages.
Response to U.S. Non-Final Office Action dated Jul. 30, 2018, for U.S. Appl. No. 15/269,097; Response filed on Sep. 25, 2018; 16 Pages.
Final Office Action dated Jan. 25, 2019 for U.S. Appl. No. 15/269,097; 33 Pages.

\* cited by examiner

SYSTEMS AND METHODS FOR SUPPRESSING UNDESIRABLE VOLTAGE SUPPLY ARTIFACTS

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of an object, such as a ferromagnetic object in the form of a gear or ring magnet, or to sense a current, as examples.

Sensors are often provided in the form of an integrated circuit (IC) containing one or more semiconductor die supporting the sensor electronic circuitry (referred to herein also as functional circuit(s)) and optionally also containing additional elements, such as a magnet and/or passive components, such as capacitors, inductors, or resistors.

Power can be supplied to sensor integrated circuits through one or more pins from an external supply, such as from a car battery. The sensor output signal(s) are sometimes provided through one or more dedicated output pins. Alternatively, some sensors encode an output in the form of a current signal on the power and ground connections. Such sensors are sometimes referred to as "two-wire" devices and advantageously have fewer pins.

Power from the external power supply can experience various disturbances that can adversely impact a sensor's ability to provide accurate output information. Power disturbances include, for example, interruptions and transients due to intermittent connections, short circuits, open circuits, and/or coupled transients.

Sensor integrated circuits are widely used in automobile control systems and other safety critical applications. It is increasingly important for sensor ICs to function properly even in the presence of power disturbances to the extent possible. Preferably, the sensor IC can withstand some level of power disturbances while still providing an accurate output.

One approach to address this problem has been to use a supply line filter, such as a resistor capacitor (RC) filter, that functions to both filter transient disturbances and store energy to power the IC during a power interruption. However, this approach is limited by the size of the passive components, as well as the degradation of supply bandwidth that can be tolerated in the case of a two-wire sensor that communicates its output through the supply lines.

Some sensors contain reset circuitry that causes the sensor, or certain portions of the sensor, to shut down if power to the IC experiences a disturbance of a certain severity (e.g., magnitude and/or duration). If operational interruption is unavoidable due to the extent of the disturbance, then it is important for the IC to restart in the proper state.

SUMMARY

In accordance with the concepts, systems, methods and techniques described herein a sensor integrated circuit is provided having a high voltage bi-directional current source and disconnect switch that are configured to suppress undesirable voltage artifacts, such as but not limited to micro-cut, brown out and/or powered electrostatic discharge (ESD), within the sensor integrated circuit.

The bi-directional current source can include a current mirror configured to protect the circuitry of the sensor integrated circuit from voltage spikes in two directions (e.g., positive and negative voltages) and/or limit current conduction in two directions. For example, the current mirror can protect the circuitry of the sensor integrated circuit from voltage spikes (e.g., positive or negative voltage spikes) on a supply voltage, such as at a power pin of the IC, and voltage spikes (e.g., positive or negative voltage spikes) at a ground pin of the IC.

In a first aspect, a sensor IC having a power pin for coupling to an external power supply, a reference pin, and a functional circuit is provided. The sensor IC includes an energy storage device and a current mirror having a current path in series between the power pin and the energy storage device and configured to control a current flow to the energy storage device and a current flow from the energy storage device. In an embodiment, the current mirror is further configured to decouple the energy storage device from the power pin.

The current mirror can include at least one MOSFET device. In some embodiments, the current mirror includes a pair of PMOS devices having a common gate connection and a common source connection.

A gate drive circuit can be coupled to a gate terminal of the MOSFET device and can include at least one switch configured to be in a first state to turn off the MOSFET device or in a second state to turn on the MOSFET device.

The current path can include a first current path and the current mirror can further include a second current path configured to establish a current to be mirrored through the MOSFET device when the at least one switch is in the second state. The gate drive circuit can include a comparison device having a first input configured to receive a voltage associated with the power pin and a second input configured to receive a voltage associated with the energy storage device. At least one switch is controlled by an output of the comparison device.

The output of the comparison device can cause the at least one switch to turn off the MOSFET device when the voltage at the power pin is less than the voltage associated with the energy storage device. In some embodiments, the output of the comparison device can cause the at least one switch to turn on the MOSFET device and to conduct a mirrored current associated with the second current path when the voltage at the power pin is greater than or equal to the voltage associated with the energy storage device.

In another aspect, a sensor IC having a power pin for coupling to an external power supply, a reference pin, and a functional circuit is provided. The sensor IC includes an energy storing means and means for controlling current having a current path in series between the power pin and the energy storage means, the means for controlling current configured to control a current flow to the energy storage means and a current flow from the energy storage means. In an embodiment, the means for controlling current is further configured to decouple the energy storage means from the power pin.

The means for controlling current can include at least one MOSFET device. In some embodiments, the means for controlling current can include a pair of PMOS devices having a common gate connection and a common source connection.

The sensor IC can include a current generating means coupled to a gate terminal of the MOSFET device and the current generating means can include at least one switching means configured to be in a first state to turn off the MOSFET device or in a second state to turn on the MOSFET device.

The current path can include a first current path and the current generating means can further include a second current path configured to establish a current to be mirrored through the MOSFET device when the at least one switching means is in the second state.

The sensor IC can include a means for comparing having a first input configured to receive a voltage associated with the power pin and a second input configured to receive a voltage associated with the energy storage device. The at least one switching means can be controlled by an output of the means for comparing.

In an embodiment, the output of the means for comparing causes the at least one switching means to turn off the MOSFET device when the voltage at the power pin is less than the voltage associated with the energy storage device. The output of the means for comparing can cause the at least one switching means to turn on the MOSFET device and to conduct a mirrored current associated with the second current path when the voltage at the power pin is greater than or equal to the voltage associated with the energy storing means.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which like reference numerals indicate like elements.

DETAILED DESCRIPTION

Figure 1:
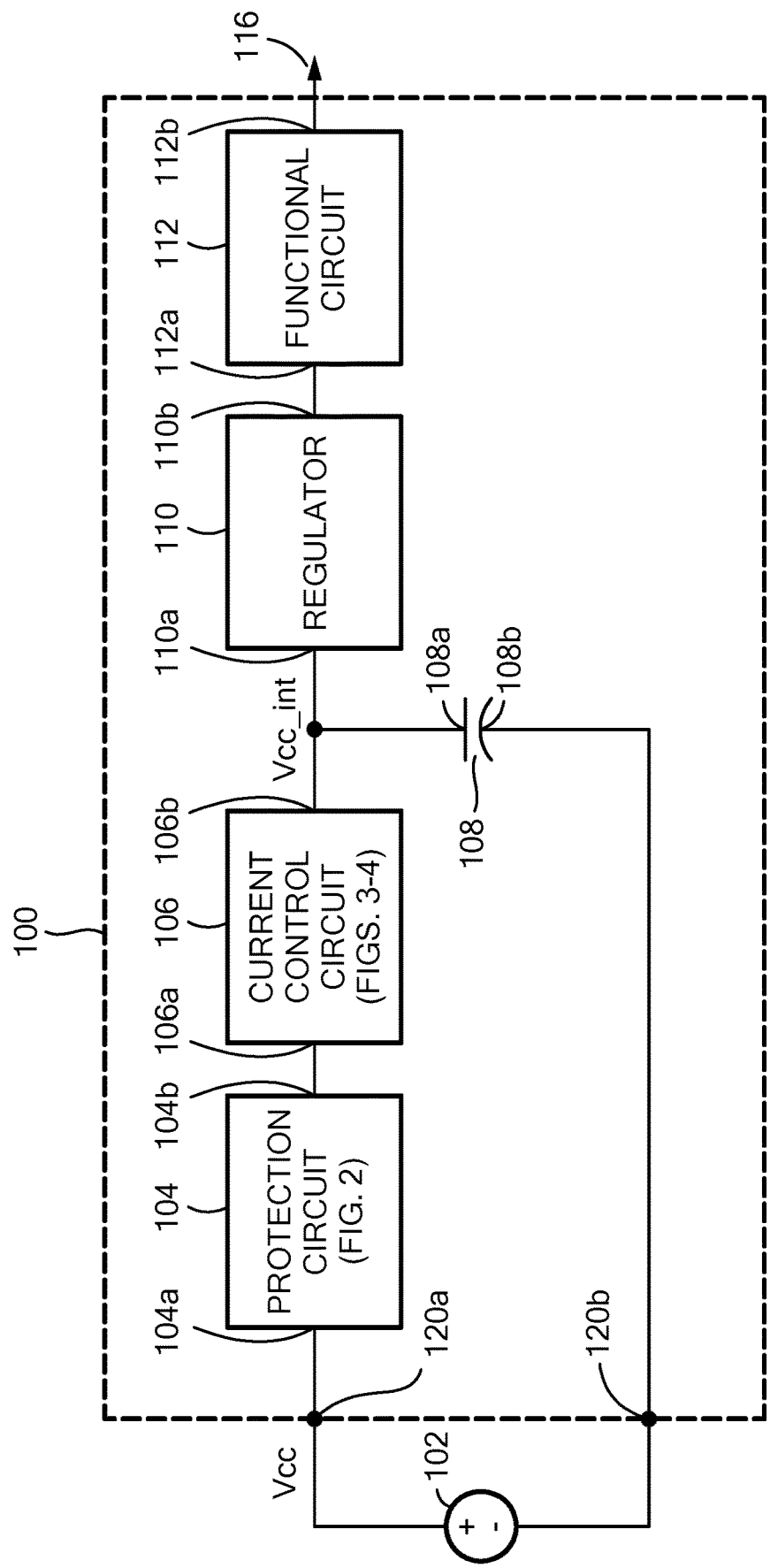
FIG. 1 shows a schematic of a sensor integrated circuit.

Now referring to FIG. 1, a sensor integrated circuit (IC) 100 includes a power pin 120a for coupling to an external power supply 102 and a reference pin 120b for coupling to an external reference potential (referred to alternatively as a ground pin).

Sensor IC 100 further includes a protection circuit 104 and a current control circuit 106 coupled between power pin 120a and a first terminal 108a of an energy storage device 108. Protection circuit 104 can be configured to protect current control circuit 106 and/or a regulator 110 and/or a functional circuit 112 of sensor IC 100 from a transient pulse, as will be described in greater detail below. Current control circuit 106 can be configured to control a current flow to energy storage device 108 and from energy storage device 108, as will be described in greater detail below. Energy storage device 108 is provided within sensor IC 100 in order to filter power to sensor IC 100 and to store energy for use by functional circuit 112 as needed under certain conditions.

As illustrated in FIG. 1, a first terminal 104a of protection circuit 104 is coupled to power pin 120a and a second terminal 104b of protection circuit 104 is coupled to a first terminal 106a of current control circuit 106. A second terminal 106b of control circuit 106 is coupled to first terminal 108a of energy storage device 108. A second terminal 108b of energy storage device 108 is coupled to reference pin 120b.

A first terminal 110a of regulator 110 is coupled to first terminal 108a of energy storage device 108. A second terminal 110b of regulator 110 is coupled to a first terminal 112a of functional circuit 112. A second terminal 112b of functional circuit 112 is coupled to an output 116 of sensor IC 100.

Functional circuit 112 is powered by a supply voltage (Vcc) provided by external power supply 102, which is coupled to sensor IC 100 through the power and reference pins 120a, 120b. Functional circuit 112 is configured to generate one or more output signal(s) 116 of sensor IC 100. Output signal 116 may be provided at a separate dedicated pin or pins of sensor IC 100 or alternatively, the output signal 116 may be provided in the form of a current signal on the power and ground signal lines through the power and reference pins 120a, 120b, respectively, in the case of a two-wire IC. In some sensors, additional connection points within sensor IC 100 can be made accessible for testing purposes only (e.g., bond pads of the semiconductor die used for wafer level testing) but are not accessible outside of sensor IC 100.

Functional circuit 112 can include one or more circuits and can take any form of electronic sensor circuitry that can be provided in the form of an integrated circuit. For example, in some embodiments, functional circuit 112 can include one or more magnetic field sensing elements. Such a magnetic field sensor IC can be used to perform various functions, including, but not limited to, a current sensor that senses a magnetic field generated by a current carried by a conductor, a magnetic switch (also referred to as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Other types of functional circuits are also possible.

Regulator 110 is coupled between current control circuit 106, energy storage device 108 and functional circuit 112. Regulator 110 can be configured to provide a substantially constant voltage to functional circuit 112 even in the presence of disturbances in the power supply voltage ($V_{CC}$) and/or disturbances in the voltage on energy storage device 108. In an embodiment, regulator 110 can be provided in the form of a linear regulator. However, it should be appreciated that other types of regulators and topologies are possible for regulator 110.

According to embodiments, sensor IC 100 includes one or more features to enable functional circuit 112 to withstand power disturbances without resetting or losing output accuracy, including protection circuit 104, current control circuit 106, energy storage device 108, and regulator 110. It will be appreciated that these features, protection circuit 104, current control circuit 106, energy storage device 108, and regulator 110, can be used alone or in any combination in order to optimize performance of the sensor IC 100 in the presence of power disturbances (e.g., voltage supply artifacts). Power disturbances may include, but are not limited to, a positive or negative voltage spike at power pin 120a, micro-cut event, and/or a positive or negative voltage spike at reference pin 120b.

Energy storage device 108 can take any suitable form with which power from external power supply 102 can be filtered and/or energy from external supply 102 can be stored. In the illustrative embodiment of FIG. 1, energy storage device 108 is provided as a capacitor. However, in other embodiments, energy storage device 108 can be provided as an inductor. It should be appreciated that although a single energy storage device 108 is shown in FIG. 1, it will be appreciated that more than one energy storage device and even a network of such devices may be used in order to achieve the desired filtering and/or energy storage functionality to suit a particular application.

Energy storage device 108 has a first terminal 108a configured to be coupled to functional circuit 110. For simplicity of discussion, wherever "capacitor" is used herein it will be understood to refer more generally to any suitable energy storage device. Furthermore, it will be appreciated that when a circuit or element is described herein as being "coupled" to another circuit or element, such coupling can be direct or indirect.

In an embodiment, first terminal 108a of energy storage device 108 is not coupled to a pin, or lead of sensor IC 100 and thus, is inaccessible from outside of the sensor IC package. By inaccessible, it is meant that the pin, or lead is not readily connectable to an element or circuit outside of the IC package. It will be appreciated however that an inaccessible pin could have a small portion that extends beyond the package (i.e., the mold material) in certain embodiments, such as those in which the lead is cut back after the mold material is formed. This configuration is advantageous because certain power disturbances, such as inductively coupled transient events, can occur on conductors used to connect sensor IC 100 to other circuitry within a larger system (e.g., a wiring harness that couples power and reference pins 120a, 120b (i.e., sensor IC pins) to external power supply 102 in an automobile). By isolating even a portion of energy storage device 108 from such external connection points, immunity to power disturbances can be improved.

Second terminal 108b of energy storage device 108 can be configured to be coupled to a reference potential. In the illustrative embodiment of FIG. 1, second terminal 108b is coupled to reference pin 120b. Alternatively, second terminal 108b can be coupled to a different reference potential and may or may not be accessible from outside of sensor IC 100. Again, isolating energy storage device 108 from events outside of sensor IC 100 can improve the immunity of the IC to certain power disturbances.

As illustrated in FIG. 1, protection circuit 104 and current control circuit 106 are coupled between power pin 120a and first terminal 108a of energy storage device 108. Protection circuit 104 can be configured to protect regulator 110 from a transient pulse on a current path from power pin 120a to first terminal 110a of regulator 110. Protection circuit 104 will be described in greater detail below with respect to FIGS. 2-2A. Current control circuit 106 can be configured to control a current flow to energy storage device 108 and a current flow from energy storage device 108. Current control circuit 106 will be described in greater detail below with respect to FIGS. 3-5D.

It should be appreciated that although FIG. 1 shows protection circuit 104 and current control circuit 106 as different elements, in some embodiments, protection circuit 104 and current control circuit 106 may be the same element or share components. For example, in some embodiments, protection circuit 104 may be a component of current control circuit 106. In other embodiments, current control circuit 106 may be a component of protection circuit 104.

In some embodiments, sensor IC 100 may include current control circuit 106 and not include protection circuit 104. In such embodiments, first terminal 106a of current control circuit 106 may be coupled to power pin 120a. In other embodiments, sensor integrated circuit 100 may include protection circuit 104 and not include current control circuit 106. In such embodiments, second terminal 104b of protection circuit 104 may be coupled to first terminal 108a of energy storage device 108.

The sensor IC 100 generally includes one or more semiconductor die supporting electronic circuitry, a lead frame having a plurality of leads through which certain connections can be made to the IC circuitry from outside of the IC, and may optionally include additional elements, such as discrete components. Portions of sensor IC 100, including at least the semiconductor die and a portion of the lead frame, are enclosed by a non-conductive mold material (sometimes referred to as the IC package) while other portions (such as connection portions of leads) extend from the mold material and permit access to connection points within the IC. Here, power (i.e., supply) and reference (i.e., ground) pins 120a, 120b are provided in the form of connection portions of leads and permit access to connection points within sensor IC 100. Thus, it will be appreciated that pins 120a, 120b of sensor IC 100 of FIG. 1 are accessible from outside of sensor IC 100 while other portions of sensor IC 100 are not.

Figure 2:
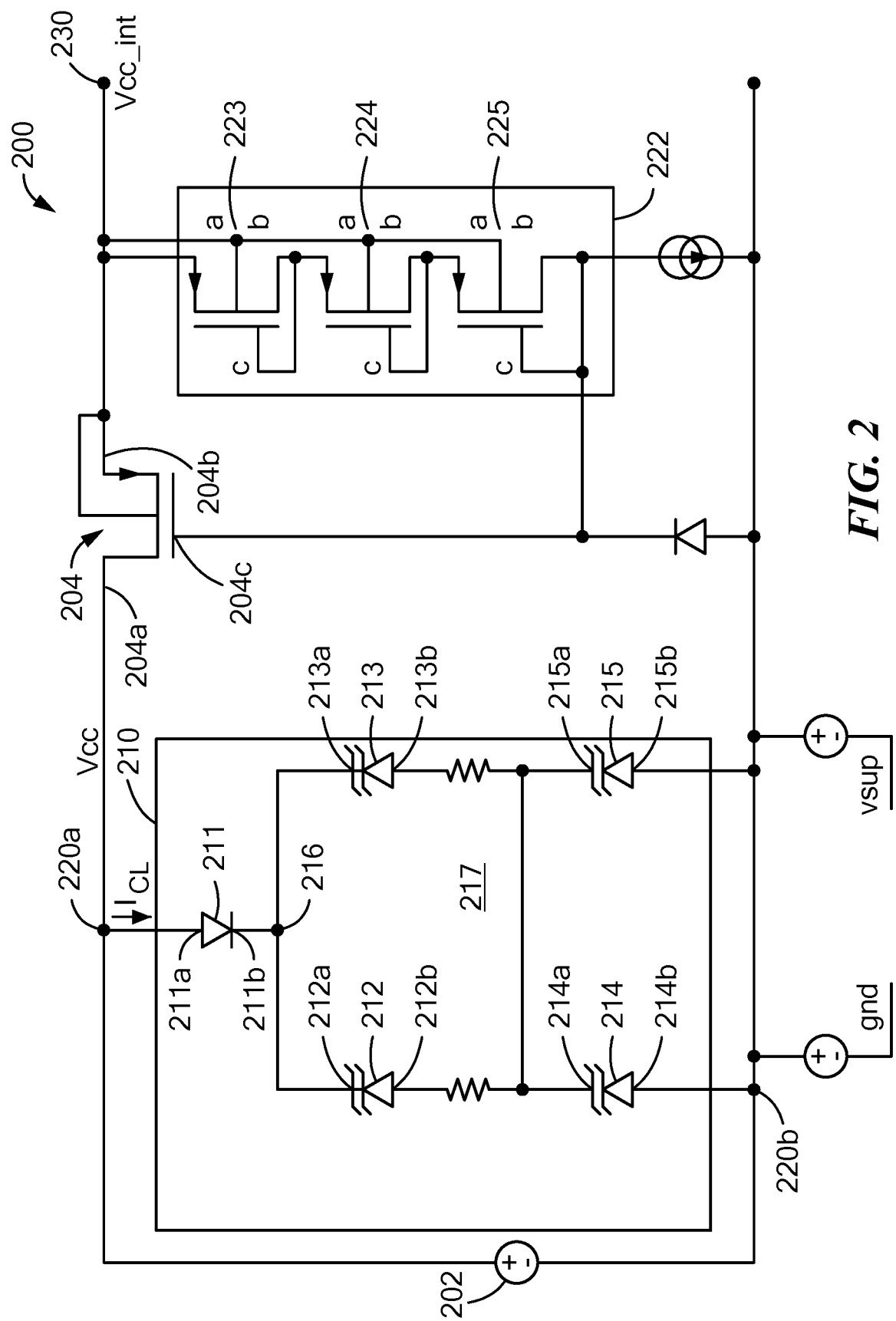
FIG. 2 shows a circuit diagram of a protection circuit of the sensor integrated circuit of FIG. 1.

Now referring to FIG. 2, a protection circuit 200 includes a power pin 220a for coupling to an external power supply 202 and a reference pine 220b for coupling to an external reference potential (referred to alternatively as a ground pin). In an embodiment, protection circuit 200 may be the same as or substantially similar to protection circuit 104 of FIG. 1. Thus, power pin 220a and reference pin 220b may be the same as or substantially similar to power pin 120a and reference pin 120b of FIG. 1.

Protection circuit 200 includes a first voltage clamp 210 coupled between power pin 220a and reference pin 220b and a reverse blocking device 204 having a first terminal 204a (e.g., drain terminal) coupled to power pin 220a, a second terminal 204b (e.g., source terminal) coupled to an output 230 of protection circuit 200, and a third terminal 204c (gate terminal).

First voltage clamp 210 can include one or more diodes 211, 212, 213, 214, 215. For example, and as illustrated in FIG. 2, first voltage clamp 210 includes a first diode 211 coupled to a diode bridge 217 having four diodes 212, 213, 214, 215.

A first terminal 211a (e.g., anode terminal) of first diode 211 is coupled to power pin 220a and a second terminal 211b (e.g., cathode terminal) of first diode 211 is coupled to bridge node 216 of the diode bridge 217. In diode bridge 217, a second diode 212 has a first terminal 212a (e.g., cathode terminal) coupled to bridge node 216 and a second terminal 212b (e.g., anode terminal) coupled to a first terminal 214a (e.g., cathode terminal) of a fourth diode 214. A second terminal 214b (e.g., anode terminal) of fourth diode 214 is coupled to a reference potential.

Still referring to diode bridge 217, a third diode 213 has a first terminal 213a (e.g., cathode terminal) coupled to bridge node 216 and a second terminal 213b (e.g., anode terminal) coupled to a first terminal 215a (e.g., cathode terminal) of a fifth diode 215. A second terminal 215b (e.g., anode terminal) of fifth diode 215 is coupled to a reference potential.

Reverse blocking device 204 can include a transistor. For example, in some embodiments, reverse blocking device 204 can include a Field Effect Transistor (FET) having a drain terminal, a source terminal, and a gate terminal. In some embodiments, reverse blocking device 204 can be provided in the form of one or more different types of p-channel metal-oxide-semiconductor field effect transistor (PMOS) devices, such as but not limited to an SG8 device.

Protection circuit 200 includes a second voltage clamp 222 coupled between the between the second terminal 204b (e.g., source terminal) of reverse blocking device 204 and the third terminal 204c (gate terminal) of reverse blocking device 204. Second voltage clamp 222 can include one or more FET(s) having a drain terminal, a source terminal, and a gate terminal. The FET(s) can be provided in the form of one or more different types of p-channel metal-oxide-semiconductor field effect transistor (PMOS) devices.

In the illustrative embodiment of FIG. 2, second voltage clamp 222 includes a first MOSFET 223 having a source terminal 223a coupled to the second terminal 204b of reverse blocking device 204 and a drain terminal 223b coupled to a gate terminal 223c of first MOSFET 223 and coupled to a first terminal 224a of a second MOSFET 224. Second MOSFET 224 includes a drain terminal 224b coupled to a gate terminal 224c of second MOSFET 224 and coupled to a first terminal 225a of a third MOSFET 225. Third MOSFET 225 includes a drain terminal 225b coupled to a gate terminal 225c of third MOSFET 225 and coupled to third terminal 204c of reverse block device 204.

In operation, first voltage clamp 210, reverse blocking device 204, and second voltage clamp 222 can be configured to block high voltages (e.g. a positive or negative voltage spike) on a current path from power pin 220a to output 230 and thus, protect circuitry within a sensor IC from the voltage spike.

For example, first voltage clamp 210 can be coupled between power pin 220a and reference pin 220b and be configured to clamp a voltage at or above a first voltage threshold or within a first voltage threshold range.

Reverse blocking device 204 can be configured to turn off in response to a voltage on the current path between current path from power pin 220a to output 230 at or above a second voltage threshold or within a second voltage threshold range. In an embodiment, the second voltage threshold and second voltage threshold range are different from the first voltage threshold and first voltage threshold range (e.g., greater than, less than).

In response to a voltage at its first terminal 204a (e.g., drain terminal) that is less than a ground voltage, reverse block device 204 can be configured to turn off and thus, stop current from conducting through to second terminal 204b. In some embodiments, reverse blocking device 204 can turn-off (e.g., simultaneously turn-off) in response to a voltage at first terminal 204a being less than a ground voltage (e.g., 0 V).

Reverse blocking device 204 can be configured to stand off and/or block high voltages (e.g., voltages greater than 100V) to protect circuity within a sensor IC, such as but not limited to sensor IC 100 of FIG. 1. For example, output 230 of protection circuit 200 can correspond to an internal node within sensor IC 100 of FIG. 1, in which an internal supply voltage can be provided to circuity within sensor IC 100. Second terminal 204b of reverse blocking device 204 can be coupled to an input of a regulator, such as but not limited to, regulator 110 of FIG. 1, and/or an energy storage device, such as not limited to, first terminal 108a of energy storage device 108.

Figure 2A:
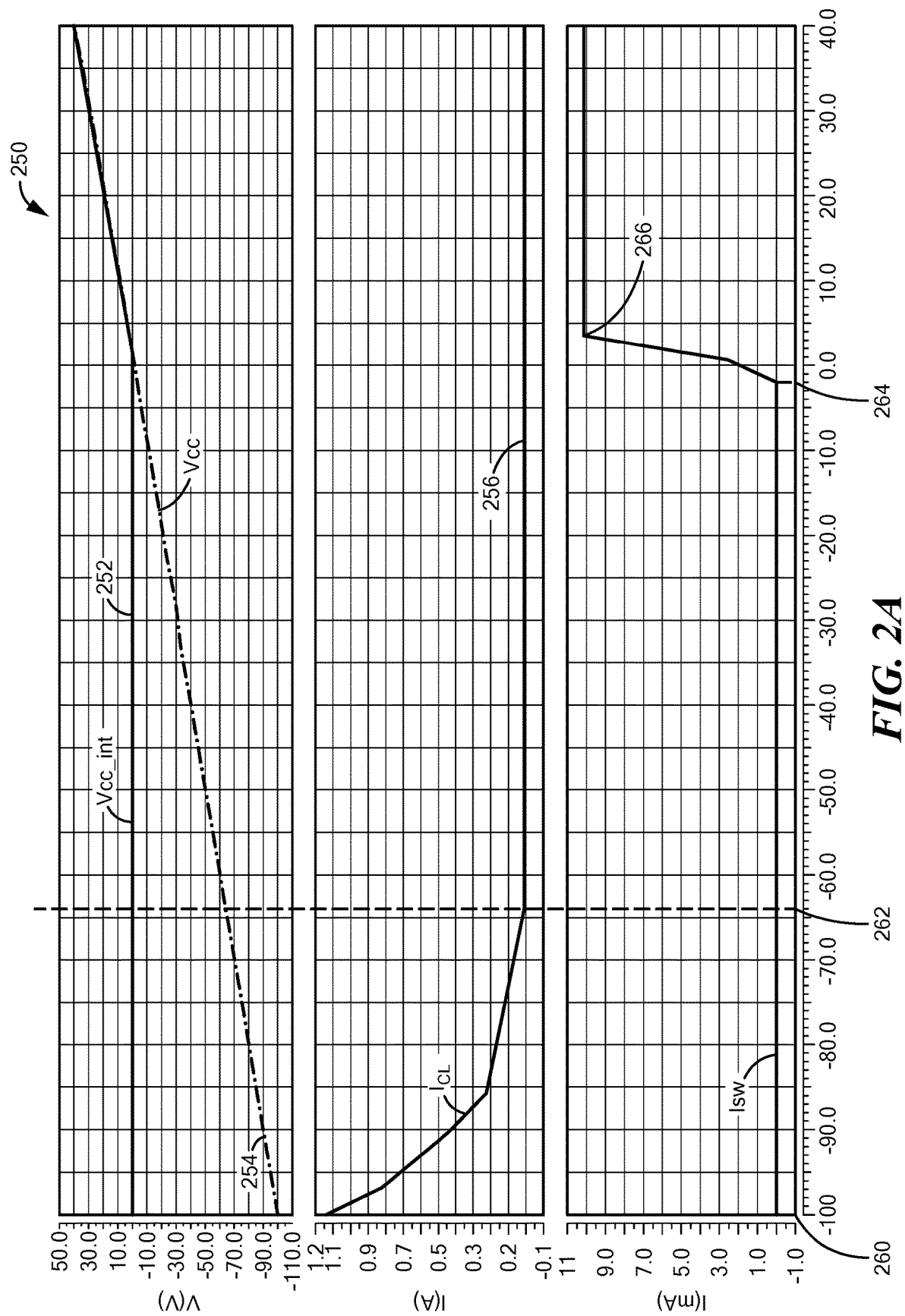
FIG. 2A shows a plot comparing the supply voltage and current to the voltage at an internal node of the protection circuit of FIG. 2, before and after operation of a switch within the protection circuit.

Now referring to FIG. 2A, a plot 250 compares current and voltage values at different points within protection circuit 200 of FIG. 2 in response to a negative voltage greater than a voltage threshold at power pin 220a, with the vertical axis (e.g., y-axis) corresponding to voltage and current values and the horizontal axis (e.g., x-axis) corresponding to time values.

In plot 250, line 252 corresponds to the voltage at output 230 of protection circuit 200 of FIG. 2. Output 230 can correspond to an internal node within sensor IC 100 of FIG. 1, such as but not limited to, a point in a current path between protection circuit 104 and first terminal 108a of energy storage device 108.

Line 254 corresponds to the supply voltage provided to power pin 220a from external power supply 202 of FIG. 2 (e.g., supply voltage provided to power pin 120a from external power supply 102 of FIG. 1). Line 256 corresponds to the current ($I_{CL}$) going into clamp 210 of protection circuit 200 of FIG. 2. Line 258 corresponds to the current ($I_{SW}$) through reverse blocking device 204 of protection circuit 200 of FIG. 2, referred to herein as "switch current."

As illustrated in FIG. 2A, the supply voltage 254 provided to power pin 220a at a first time 260 can be greater than a second voltage threshold, here −100V. The first voltage clamp 210 can be configured to clamp current or begin clamping current when supply voltage is at the second voltage threshold. For example, in one embodiment, when $V_{CC}$ is at −100V, the first voltage clamp 210 clamps the voltage to this level (i.e., first voltage clamp 210 conducts current $I_{CL}$ 256 to ensure that the voltage from first terminal 204a to third terminal 204c does not exceed 100V).

In response to the second threshold voltage (−100 V) at power pin 220a, the reverse blocking device 204 can be off and thus, essentially no current flows through reverse blocking device 204. Further, the output voltage 252 (or internal node voltage) can be maintained such as by charge stored on energy storage device 108 (FIG. 1). Thus, the circuitry within the sensor IC can be protected from a negative voltage spike on power pin 220a.

At a second time 262, the supply voltage 252 can reach the first voltage threshold, here −60 V. As the supply voltage has decreased from the second voltage threshold (−100 V) to the first threshold (−60 V), the reverse blocking device 204 can be configured to hold off the −60 V spike. Thus, essentially no current flows through first voltage clamp 210 and reverse blocking device 204 can stand off (withstand) the −60 V spike.

At a third time 264, the supply voltage 254 can transition from a negative value to a positive value and be greater than 0 V. Thus, the voltage at first terminal 204a of reverse blocking device 204 is greater than a ground potential and reverse blocking device 204 can turn on. At third time 264, in response to reverse blocking device 204 turning on, the output voltage 230, and thus the voltage provided to circuity within a sensor IC, can increase in relation to the supply voltage 254. In FIG. 2A, the output voltage 252 follows or tracks supply voltage 254. Significantly, when the reverse blocking device 204 conducts, the voltage $V_{CC}$ differs from the voltage Vcc_int by substantially only the voltage dips across the source and drain terminals 204a, 204b of reverse blocking device 204. This is in contrast to conventional voltage protection schemes utilizing a series resistor to dissipate energy, which the resistor could introduce significant voltage drop and power losses.

Further, in response to reverse blocking device 204 turning on, the switch current 258 can increase until reaching a current limit 266 and maintain the current limit 266 while reverse blocking device 204 is active. It should be appreciated that the current limit 266 can vary and correspond to the properties of the particular reverse blocking device used and a particular application of the protection circuit.

Thus, and as illustrated in FIG. 2A, protection circuit 200 of FIG. 2 can be configured to protect circuitry within a sensor IC, such as but not limited to sensor IC 100 of FIG. 1, from voltage spikes (e.g., transient pulse) on a connection from an external supply 202 of FIG. 2 to the sensor IC.

Figure 3:
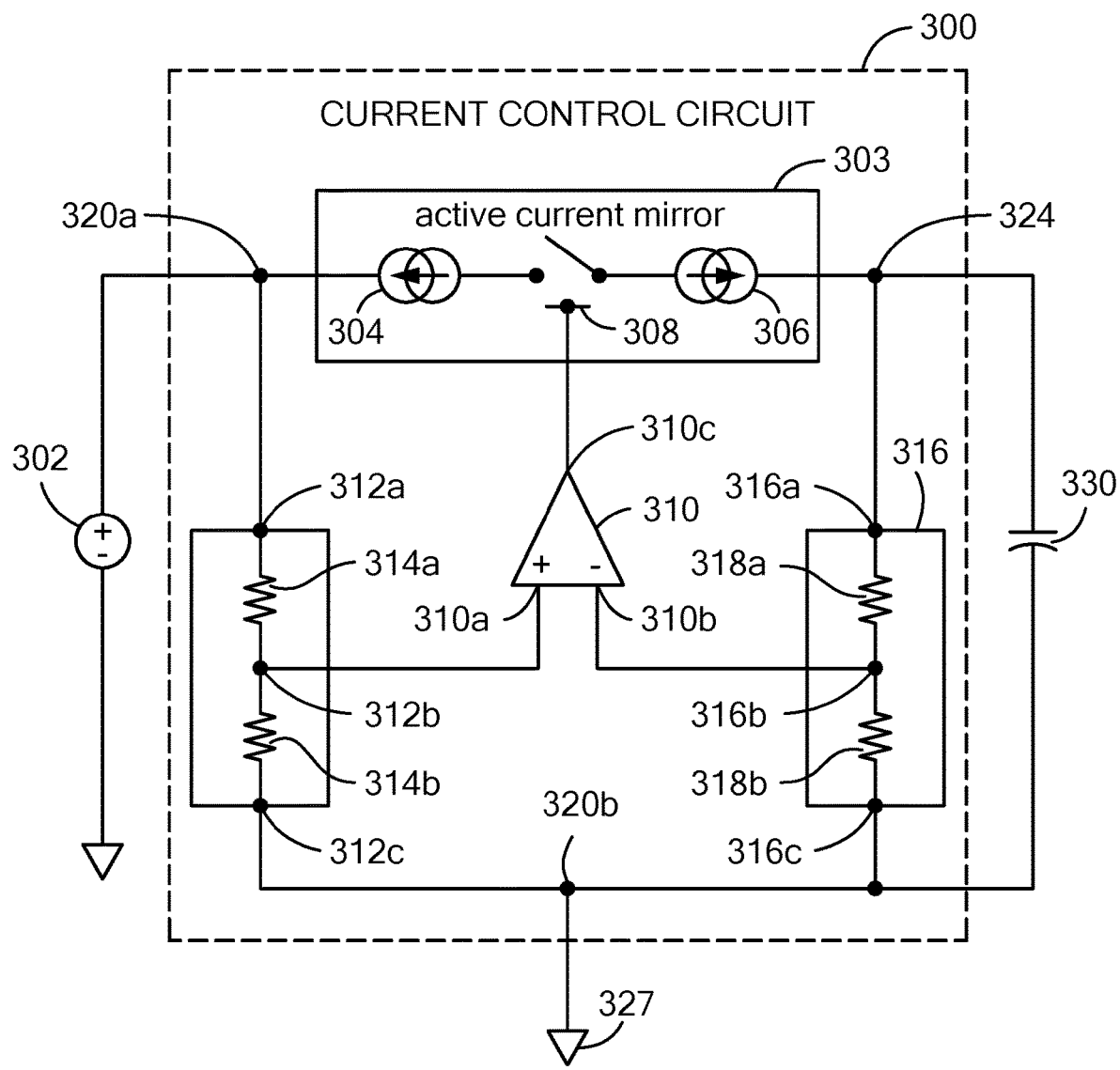
FIG. 3 shows a circuit diagram of a current control circuit of the sensor integrated circuit of FIG. 1.

Now referring to FIG. 3, a current control circuit 300 is coupled to an external power supply 302 through a power pin 320a. Current control circuit 300 includes a current mirror 303 having a first current source 304 coupled to a second current source 306 through a switch 308. First current source 304 is coupled to power pin 320a. Second current source 306 is coupled to an internal node 324. Current control circuit 300 can be coupled to an energy storage device 330 through internal node 324. In an embodiment, switch 308 can be configured, in a first state (e.g., open) to turn off current mirror 303 and in a second state (e.g., closed) to turn on current mirror 303 such that first and second current sources 304, 306 can provide the same current.

For example, current control circuit 300 includes a comparator 310, and first and second resistor dividers 312, 316. First and second resistor dividers 312, 316 can include two resistive elements 314a, 314b, 318a, 318b, respectively, and are configured to generate a voltage that is a fraction of the voltage at an input.

First resistor divider 312 has a first terminal 312a coupled to power pin 320a to receive a supply voltage from external power supply 302. First resistor divider 312 is configured to generate an output voltage at a second terminal 312b that is proportional to (e.g., fraction of) or otherwise associated with the supply voltage from external power supply 302. Second terminal 312b is coupled to a first input 310a of comparator 310.

Second resistor divider 316 has a first terminal 316a coupled to internal node 324 to receive a voltage associated current mirror 303 and/or energy storage device 330. The voltage provided to first terminal 316a can depend on a state of switch 308. For example, if switch 308 is in the first state, the voltage received at first terminal 316a can be associated with energy storage device 330. If switch 308 is in the second state, the voltage received at first terminal 316a can be associated with current mirror 303.

Second resistor divider 316 is configured to generate an output voltage at a second terminal 316b that is proportional to (e.g., fraction of) or otherwise associated with the voltage from current mirror 303 and/or energy storage device 330. Second terminal 316b is coupled to a second input 310b of comparator 310.

Comparator 310 is configured to compare the voltage from first and second resistor dividers 312, 316 and thus compare the voltage from external power supply 302 to the voltage from current mirror 303 and/or energy storage device 330 and generate an output corresponding to the difference between the voltages at an output 310c. Output 310c is coupled to switch 308 and can be configured to control switch 308 such that switch 308 transitions from the first state to the second state and/or from the second state to the first state in response the output from comparator 310.

The output 310c of comparator 310 can cause switch 308 to transition from the second state to the first state and thus turn off current mirror 303 when the voltage at power pin 320a is less than the voltage at internal node 324 (e.g., voltage associated with energy storage device 330). In some embodiments, output 310c of comparator 310 can cause switch 308 to transition from the first state to the second state and thus turn on current mirror 303 when the voltage at power pin 320a is greater than or equal to the voltage at internal node 324 (e.g., voltage associated with energy storage device 330). In an embodiment, when current mirror 303 is on, current mirror 303 can conduct a mirrored current through first and second current sources 304, 306 such that first and second current sources 304, 306 provide the same current.

As illustrated in FIG. 3, a third terminal 312c of first resistor divider 312 and a third terminal 316c of second resistor divider 316 can be coupled to a reference pin 320b. Reference pin 302b is coupled to an external reference potential 322.

In an embodiment, current mirror 303 can be a bi-directional current mirror and thus, control current flow to energy storage device 330 and control current from energy storage device 330. For example, current mirror 303 can limit and/or otherwise control the charging and discharging properties of energy storage device 330 by controlling the current to and from energy storage device 330. Thus, in response to events within an IC, such as but not limited to a voltage spike on a supply voltage, a voltage spike at a ground pin, and/or a micro-cut event, current mirror 303 can protect energy storage device 330 (and functional circuits coupled to node 324) from high voltages, block high reverse voltages and limit current conduction in both directions, as will be discussed in greater detail below with respect to FIGS. 5-5D below.

Figure 4:
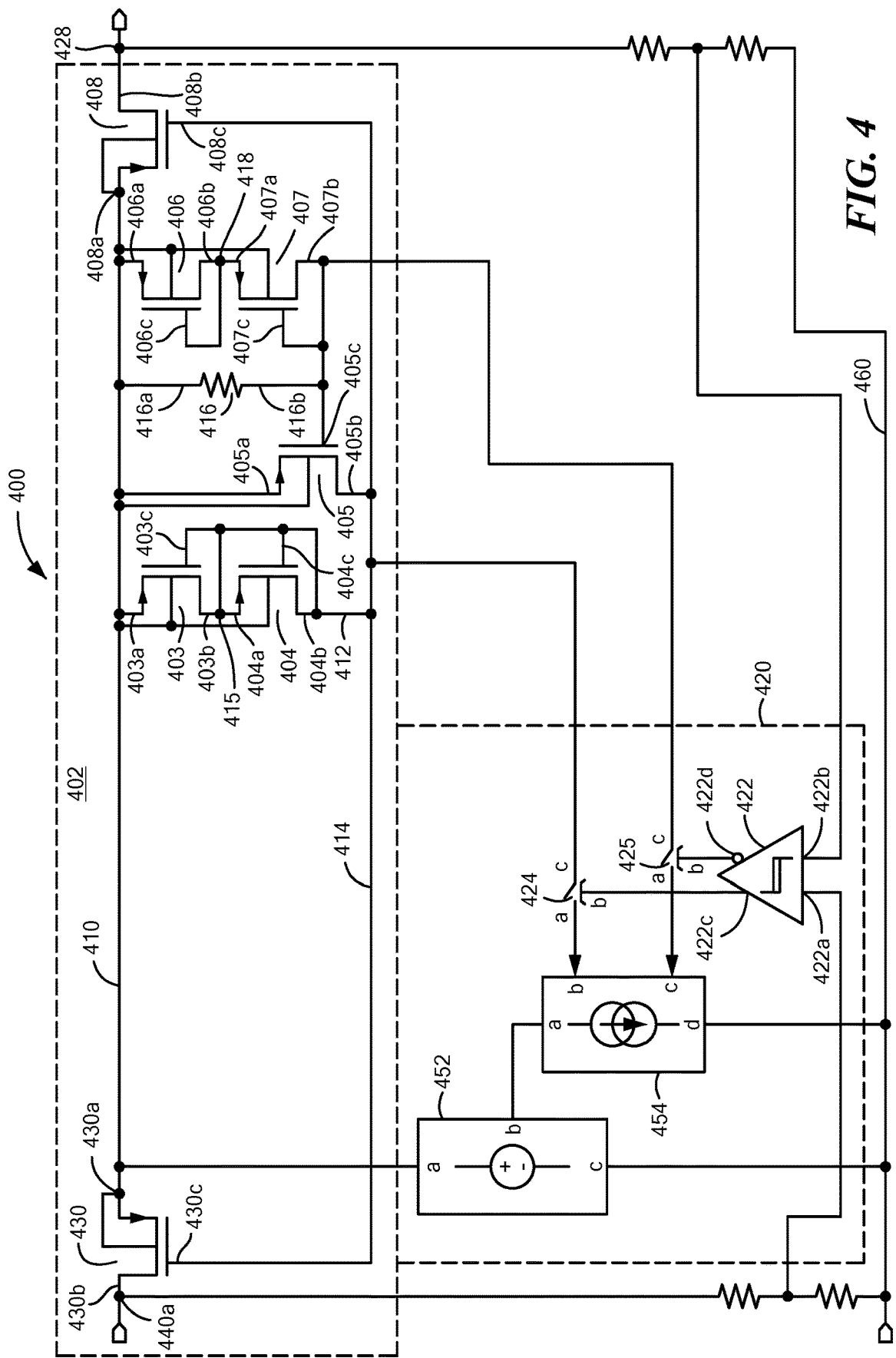
FIG. 4 shows a schematic of the current control circuit of the sensor integrated circuit of FIG. 1.

Now referring to FIG. 4, a current control circuit 400 is coupled to an external power supply (not shown) through a power pin 440a. Current control circuit 400 includes a current mirror 402 and a gate drive circuit 420. In some embodiments, a protection circuit 430 can be disposed in a current path between power pin 440a and current mirror 402.

Current mirror 402 can have a first current path 410 in series with power pin 440a and an energy storage device (e.g., energy storage device 108 of FIG. 1), with the energy storage device coupled to an internal node 428. Current mirror 402 can be configured to control a current flow to the energy storage device and current flow from the energy storage device. In some embodiments, current mirror 402 can decouple the energy storage device from power pin 440a.

Current mirror 402 includes one or more metal-oxide-semiconductor field-effect transistor (MOSFET) devices 403, 404, 405, 406, 407, 408, here six MOSFETs.

Current mirror 402 includes a first MOSFET 403 and a second MOSFET 404 disposed along a second current path 412 that is coupled between first current path 410 and a gate current path 414. First MOSFET 403 has a source terminal 403a coupled to first current path 410 and a drain terminal 403b coupled to a source terminal 404a of second MOSFET 404. A drain terminal 404b of second MOSFET 404 is coupled to gate current path 414. In some embodiments, a gate terminal 403c of first MOSFET 403 and a gate terminal 404c of second MOSFET 404 can be coupled to a first node 415 between drain terminal 403c and source terminal 404a.

Current mirror 402 includes a third MOSFET 405 coupled between first current path 410 and gate current path 414. For example, and as illustrated in FIG. 4, a source terminal 405a is coupled to first current path 410 and a drain terminal 405b is coupled to gate current path 414. A gate terminal 405c of third MOSFET is coupled to a resistive element 416, a gate terminal 407c of a fifth MOSFET 407 and a drain terminal 407b of fifth MOSFET 407.

Resistive element (e.g., resistor) 416 has a first terminal 416a coupled to first current path 410 and a second terminal 416b coupled to gate terminal 405c, gate terminal 407c and drain terminal 407b.

A fourth MOSFET 406 has a source terminal 406a coupled to first current path 410 and a drain terminal 406b coupled to a source terminal 407a of fifth MOSFET 407. A gate terminal 406c of fourth MOSFET is coupled to a second node 418 coupled to drain terminal 406b of fourth MOSFET 406 and source terminal 407a of fifth MOSFET 407.

A sixth MOSFET 408 is disposed on first current path 410 having a source terminal 408a coupled to power pin 440a and a drain terminal 408b coupled to internal node 428. In some embodiments, protection circuit 430 (that may be the same as or similar to reverse blocking device 204 of FIG. 2) may be disposed between power pin 440a and sixth MOSFET 408. In such embodiments, a source terminal 430a of protection circuit 430 can be coupled to source terminal 408a of sixth MOSFET. A gate terminal 430c of protection circuit 430 can be can be coupled to a gate terminal 408c of sixth MOSFET along gate current path 414. Thus, protection circuit 430 and sixth MOSFET 408 can have a common gate connection and/or a common source connection.

Gate drive circuit 420 can include a voltage source 452, a current source 454, and a comparator 422. Voltage source 452, current source 454 and comparator 422 can be coupled to the current mirror 402 through one or more switches 424, 425. In an embodiment, gate drive circuit 420 can be configured to turn on and/or off one or more of MOSFETs 403, 404, 405, 406, 407, 408, and 430 of current mirror 402 in response to a voltage difference between a voltage level at power pin 440a and a voltage at internal node 428 (or energy storage device coupled to internal node 428).

Voltage source 452 has a first terminal 452a coupled to first current path 410 to receive a voltage from power pin 440a or protection circuit 430, a second terminal 454b coupled to a first terminal 454a of current source 454 to provide a voltage value corresponding to the voltage on first current path 410, and a third terminal 452c coupled to a reference potential (referred to alternatively as a ground pin) 460.

Current source 454 is coupled to receive a voltage value from voltage source 452 through first terminal 454a. Current source has a second terminal 454b coupled to provide a bias value to a first switch 424a, a third terminal 454c coupled to provide a bias value to a second switch 424b, and a fourth terminal 454d coupled to reference potential 460.

Comparator 422 has a first input 422a coupled to power pin 440a through a resistor divider to receive a voltage indicative of the supply voltage and a second input 422b coupled to drain terminal 408b of sixth MOSFET 408 and internal node 428 through a resistor divider as shown. First input 422a can receive a voltage associated with power pin 440a and second input 422b can receive a voltage associated with an energy storage device coupled to internal node 428. For example, second input 422b can receive a voltage corresponding to the voltage being provided to and/or across the energy storage device.

Comparator 422 can be configured to compare the voltage associated with power pin 440a (e.g., supply voltage) to the voltage associated with the energy storage device and generate an output signal corresponding to the difference between the voltage associated with power pin 440a and the voltage associated with the energy storage device. Comparator 422 can use the output signal to control first and second switches 424, 425 and thus turn on or off current mirror 402.

For example, first switch 424 can include a first terminal 424a coupled to second terminal 454b of current source 454, a second terminal 424b coupled to a first output 422c of comparator 422, and a third terminal 424c coupled to gate current path 414. Second switch 425 can include a first terminal 425a coupled to third terminal 454c of current source 454, a second terminal 425b coupled to a second output 422d of comparator 422, and a third terminal 425c coupled to gate current path 414.

In an embodiment, comparator 422 can provide an output signal to first switch 424 through first output 422c to turn on current mirror 402 and provide an output signal to second switch 424 through second output 422d to turn off current mirror 402. For example, first and third terminals 424a, 424c can be coupled together when current mirror 402 is off or otherwise de-activated. First and third terminals 425a, 425c can be coupled together when current mirror 402 is on or otherwise activated. It should be appreciated that in some embodiments, comparator 422 may have one output and this gate drive circuit 420 may include one switch to turn on and/or off current mirror 402.

In an embodiment, comparator 422 can operate first and/or second switches 424, 425 to turn off current mirror 402 when the voltage at power pin 440a is less than the voltage at internal node 428 (e.g., voltage associated with energy storage device). When the voltage at power pin 440a is greater than or equal to the voltage at internal node 428 (e.g., voltage associated with energy storage device 330), comparator 422 can operate first and/or second switches 424, 425 to turn on current mirror 402. In an embodiment, when current mirror 402 is on, current mirror 402 can conduct a mirrored current to internal node 428 and thus to the energy storage device coupled to internal node 428. The second current path 412 can establish the current to be mirrored by current mirror 402. In some two-wire sensor embodiments, the second current path 412 can be modulated (i.e., adjusted) to ensure that the mirrored current remains below the two-wire output specifications, both during startup and normal operation. For example, the current limit may be adjusted in a discrete manner or in a more adaptive manner that may include active, continuous and/or periodic adjustment. An example discrete modulation of the current limit may limit the mirrored current to a first level such as 2 mA during the application of power until the internal storage capacitor charges to a predetermined voltage threshold at which point it may be increased to a second level such as 7 mA for normal operation. An example of continuous current limit adjustment may include adjusting the second current path to limit the mirrored current to a predetermined level regardless of the load during startup and through normal operation.

In an embodiment, current mirror 402 can be a bi-directional current mirror and control current flow to the energy storage device and control current from the energy storage device. As will be shown in FIGS. 5-5D below, in response to events within an IC, such as but not limited to a voltage spike on at power pin 440*a*, a voltage spike at a ground pin 460, and/or a micro-cut event, current mirror 402 can protect the energy storage device and functional circuits coupled to node 428 from high voltages, block high reverse voltages and limit current conduction in both directions that may result from such events.

Figure 5:
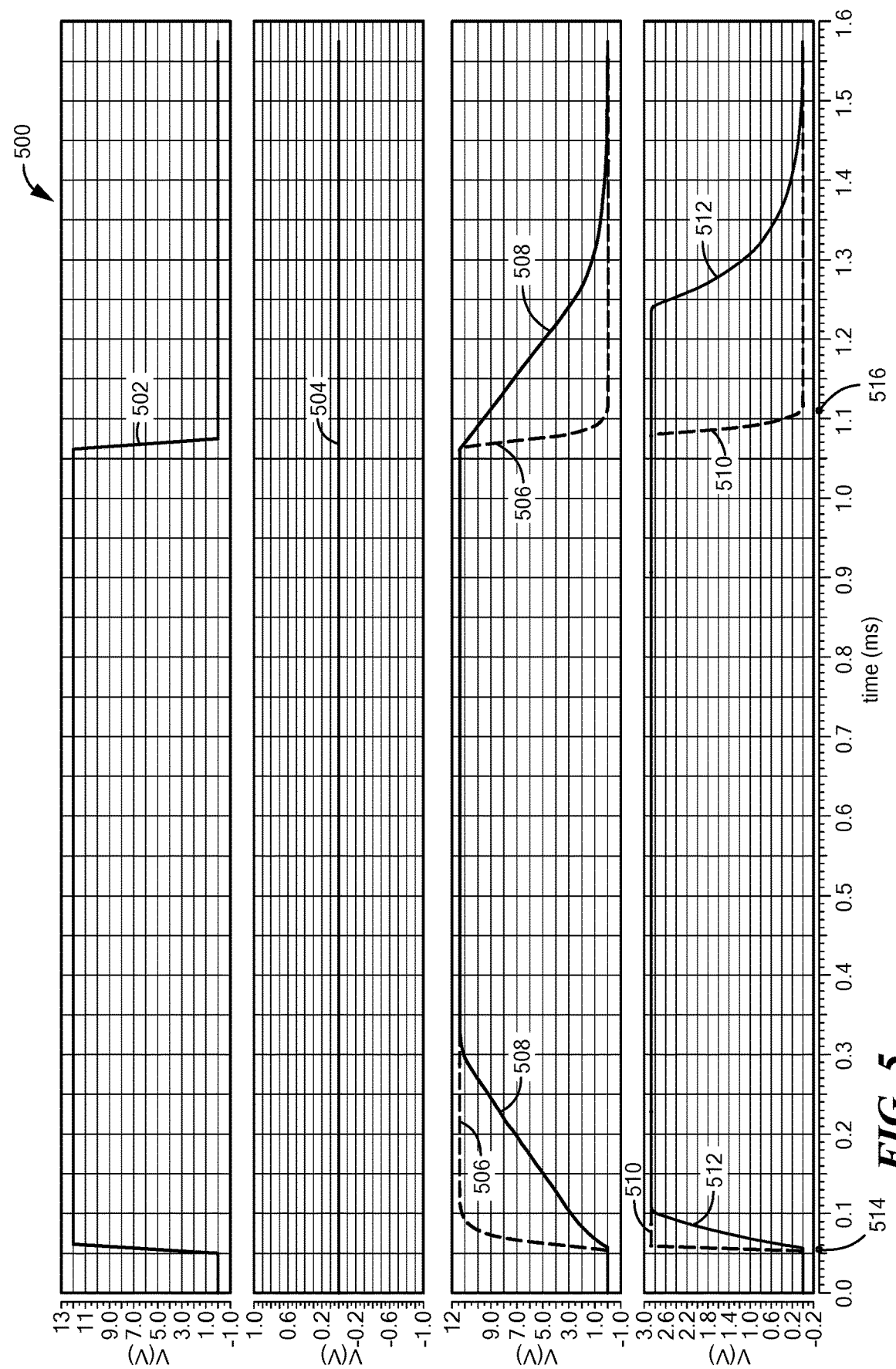
FIG. 5 shows a plot comparing responses of a sensor integrated circuit having a current mirror to a response of a sensor integrated circuit not having a current mirror during a micro-cut event within the respective sensor integrated circuits.

Now referring to FIG. 5, a plot 500 illustrates responses of an IC having a resistor coupled to an energy storage device to dissipate supply voltage transient energy to a response of an IC having a bidirectional current mirror such as that shown in FIG. 4 during a micro-cut event at a supply voltage of the respective ICs.

In particular, plot 500 compares voltages 506, 508 across an energy storage device (e.g., energy storage device 180 of FIG. 1) and voltages 510, 512 across a voltage regulator element (e.g., voltage regulator 110 of FIG. 1). For example, waveform 506 corresponds to the voltage across an energy storage device of an integrated circuit (IC) having a resistor coupled to the energy storage device and waveform 510 corresponds to the voltage at the internal regulator. Waveform 508 corresponds to the voltage across an energy storage device of an IC having a bidirectional current mirror coupled to the energy storage device and waveform 512 corresponds to the voltage at the internal regulator. Further, plot 500 shows a positive supply voltage 502 (e.g., Vcc) provided to a power pin of the IC from an external power supply.

At a first time 514, supply voltage 502 can increase from a first voltage level (e.g., 0 v) to a second, different voltage level (e.g., 12 v). When supply voltage 502 increases to the second voltage level, waveform 506 increases from the first voltage level to the second voltage level at a faster rate than waveform 508. Further, waveform 510 increases from the first voltage level to the second voltage level at a faster rate than waveform 512. In an embodiment, the bidirectional current mirror can be configured to control the charging properties of the energy storage device as compared to other elements such as a resistor.

At a second time 516, supply voltage 502 can decrease from the second voltage level to the first voltage level. In some embodiments, the second time 516 may correspond to a cutting of the supply voltage to the IC such as but not limited to during a micro cut event.

When supply voltage 502 decreases from the second voltage level to the first voltage level, waveform 506 decreases from the second voltage level to the first voltage level at a faster rate than waveform 508. Further, waveform 510 decreases from the second voltage level to the first voltage level at a faster rate than waveform 512. As illustrated in FIG. 5, the bidirectional current mirror can be configured to control the discharging properties of the energy storage device as compared to other elements such as a resistor. Thus, the energy storage device can maintain its charge longer and be configured to supply power to additional circuity within or coupled to the IC during the micro cut event. In an embodiment, an IC having a bidirectional current mirror can control the voltage and/or current provided to the energy storage device.

Figure 5A:
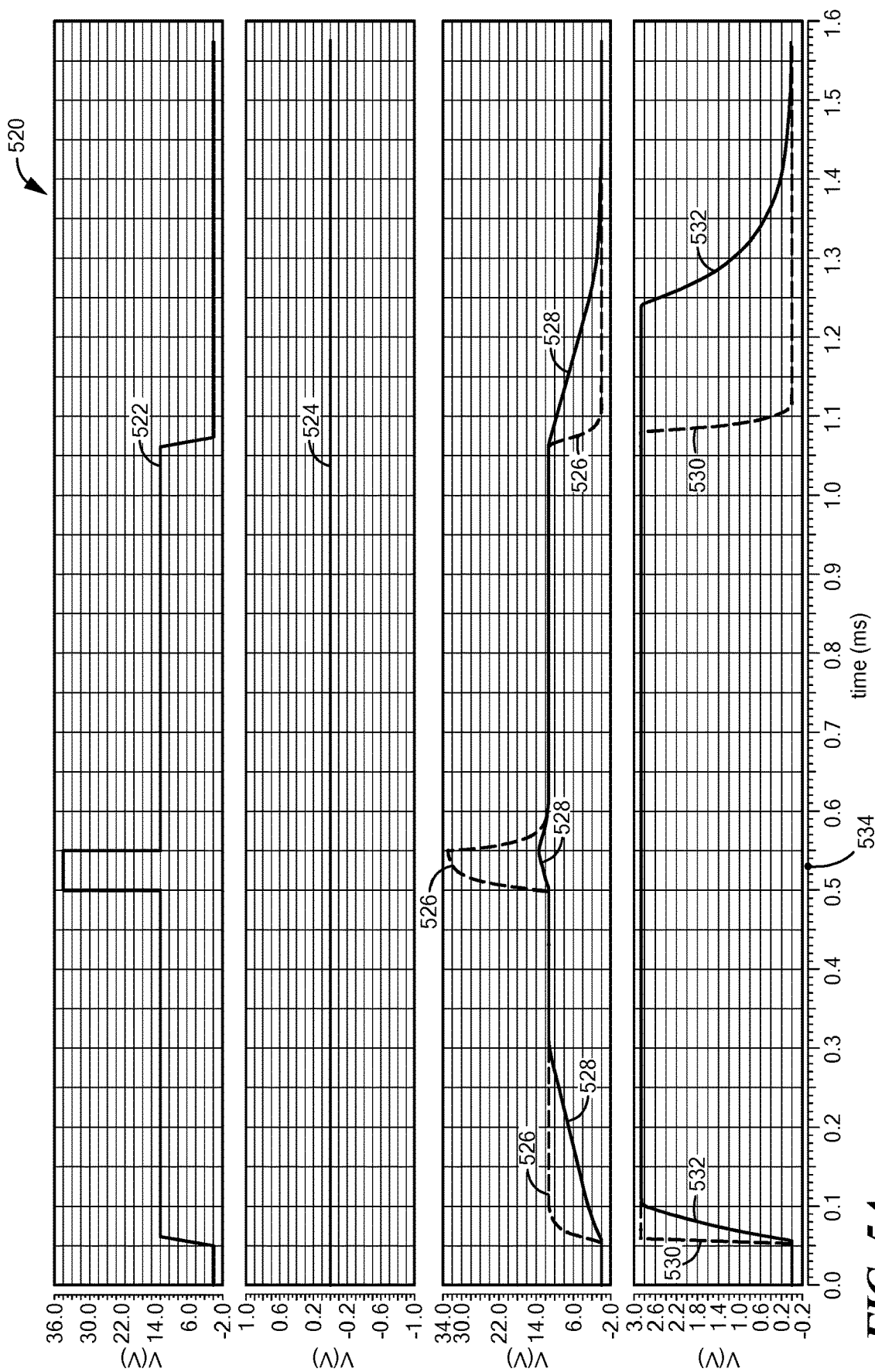
FIG. 5A shows a plot comparing responses of a sensor integrated circuit containing the current control circuit of FIG. 4 to a response of a sensor integrated circuit not containing the current control circuit of FIG. 4 during a positive voltage spike event at a supply voltage of the respective sensor integrated circuits.

Now referring to FIG. 5A, plot 520 illustrates responses of an IC having a resistor coupled to an energy storage device to dissipate supply voltage transient energy to a response of an IC having a bidirectional current mirror such as that shown in FIG. 4 during a positive voltage spike event at a supply voltage of the respective ICs.

In plot 520, waveform 526 corresponds to the voltage across an energy storage device of an IC having a resistor coupled to the energy storage device and waveform 530 corresponds to the voltage at the internal regulator. Waveform 528 corresponds to the voltage across an energy storage device of an IC having a bidirectional current mirror coupled to the energy storage device and waveform 532 corresponds to the voltage at the internal regulator.

Further, plot 520 shows a positive supply voltage 522 (e.g., $V_{CC}$) provided to power pin 440*a* of the IC from an external power supply and a ground voltage at a ground pin of the IC from the external power supply. In an embodiment, supply voltage 522 of plot 520 may be similar to supply voltage 502 of plot 500, however at a first time 534 a voltage spike may occur on the supply voltage 522. In response to the voltage spike at first time 534, waveform 526 may spike as well resulting in an increase in the current into the energy storage device. In contrast, waveform 528 increases less than waveform 526 in response to the voltage spike. Thus, the bidirectional current mirror can limit the current into energy storage device during an event such as a voltage spike on the supply voltage and suppress voltage excursions from internal nodes with in the respective IC to protect other circuitry within the IC.

Figure 5B:
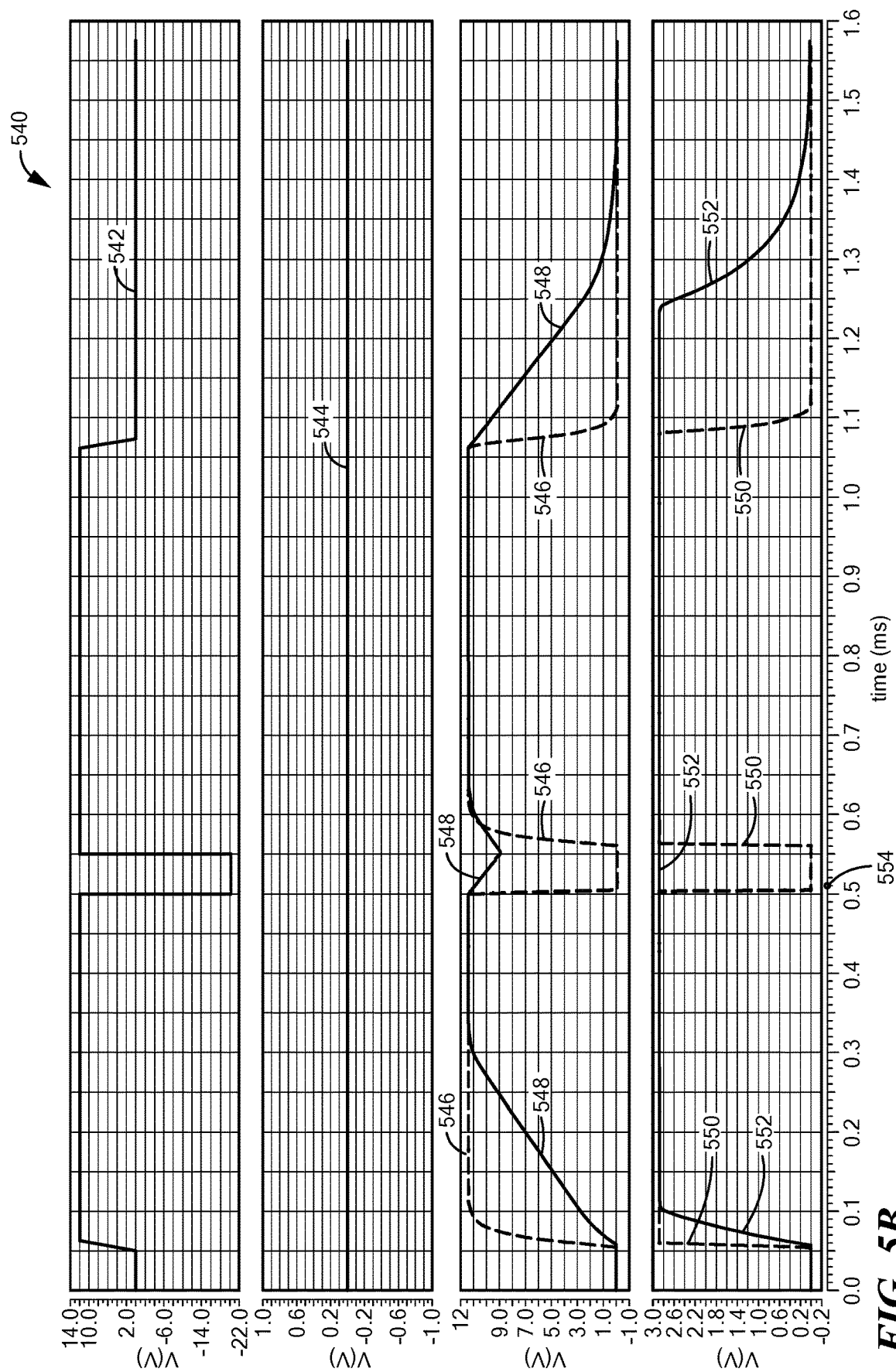
FIG. 5B shows a plot comparing responses of a sensor integrated circuit containing the current control circuit of FIG. 4 to a response of a sensor integrated circuit not containing the current control circuit of FIG. 4 during a negative voltage spike event at the supply voltage of the respective sensor integrated circuits.

Now referring to FIG. 5B, a plot 540 *c* illustrates responses of an IC having a resistor coupled to an energy storage device to dissipate supply voltage transient energy to the response of an IC having a bidirectional current mirror coupled to an energy storage device such as that shown in FIG. 4 during a negative voltage spike event at a supply voltage of the respective ICs. For example, waveform 546 corresponds to the voltage across an energy storage device of an IC having a resistor coupled to the energy storage device and waveform 550 corresponds to the voltage at the internal regulator. Waveform 548 corresponds to the voltage across an energy storage device of an IC having a bidirectional current mirror coupled to the energy storage device and waveform 552 corresponds to the voltage at the internal regulator.

Further, plot 540 shows a positive supply voltage 542 (e.g., $V_{CC}$) provided to a power pin of the IC from an external power supply and ground voltage 544 (e.g., $V_{GND}$) of the IC.

At a time 554, a negative voltage spike occurs on supply voltage 542. In response to the negative voltage spike, waveform 546 decreases in a corresponding fashion to the negative voltage spike. However, waveform 548 experiences a small change in value in response to the negative voltage spike. Thus, the bidirectional current mirror is configured to limit the discharging of the energy storage device during an event such as a negative voltage spike on a supply voltage 542 to the IC.

At time 554, waveform 550 also decreases in a corresponding fashion to the negative voltage spike. However, waveform 552 experiences no change or a minimal change in value in response to the negative voltage spike. The bidirectional current mirror can maintain its voltage level during an event such as a negative voltage spike on a supply voltage 542 to the IC and limit the change in value (e.g., discharge) of the energy storage device it is coupled to.

Figure 5C:
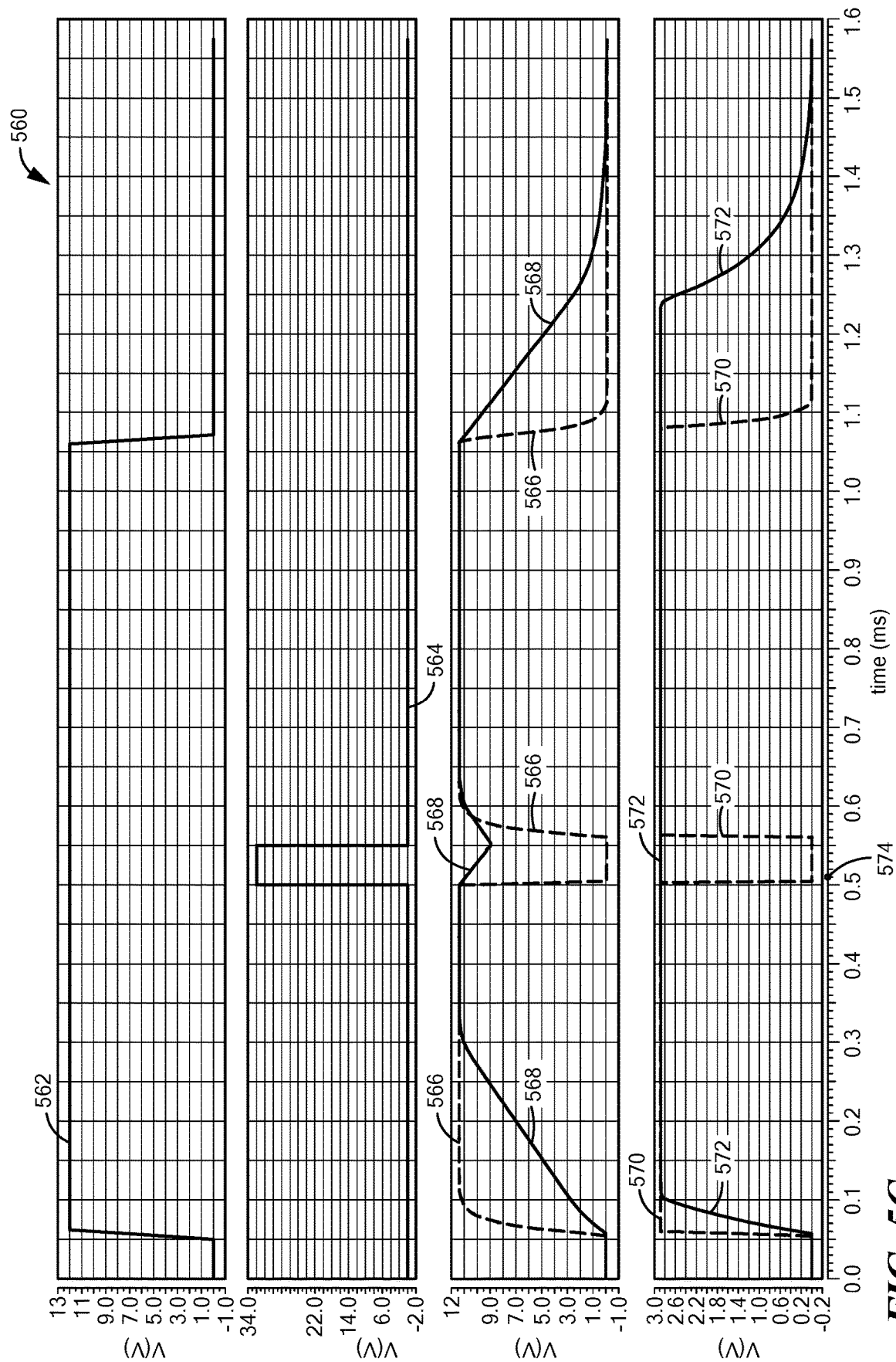
FIG. 5C shows a plot comparing responses of a sensor integrated circuit containing the current control circuit of FIG. 4 to a response of a sensor integrated circuit not containing the current control circuit of FIG. 4 during a positive voltage spike event at a ground terminal of the respective sensor integrated circuits.

Now referring to FIG. 5C, a plot 560 illustrates responses of an IC having a resistor coupled to an energy storage device to dissipate supply voltage transient energy to the response of an IC having a bidirectional current mirror coupled to an energy storage device such as that shown in FIG. 4 during a positive spike at a ground pin (or ground terminal) of the respective ICs. For example, waveform 566 corresponds to the voltage across an energy storage device of an IC having a resistor coupled to the energy storage device and waveform 570 corresponds to the voltage at the internal regulator. Waveform 568 corresponds to the voltage across an energy storage device of an IC having a bidirectional current mirror coupled to the energy storage device and waveform 572 corresponds to the voltage at the internal regulator.

In plot 560, a positive supply voltage 562 (e.g., Vcc) is provided to a power pin of the IC from an external power supply and ground voltage 564 represents the voltage level at a ground pin of the IC. At a time 574, a positive spike occurs at the ground pin resulting in a positive spike in ground voltage 564. In response to the positive spike on the ground voltage 564, waveform 566 decreases in a corresponding opposite fashion (e.g., by the same or similar but opposite voltage value) to the positive voltage spike resulting in a negative voltage spike on waveform 566, the voltage across the energy storage device. However, waveform 568 experiences a small change in value in response to the positive voltage spike and thus, discharging of the energy storage device coupled to the bidirectional current mirror is limited during an event such as a positive voltage spike at the ground pin of the IC.

Further, waveform 570 also decreases in a corresponding opposite fashion (e.g., by the same or similar but opposite voltage value) to the positive voltage spike resulting in a negative voltage spike on waveform 570, the voltage across the energy storage device. However, waveform 572 experiences no change or a minimal change in value in response to the positive voltage spike. The bidirectional current mirror can maintain its voltage level during an event such as a positive voltage spike at the ground pin of the IC to and limit the change in value (e.g., discharge) of the energy storage device it is coupled to.

Figure 5D:
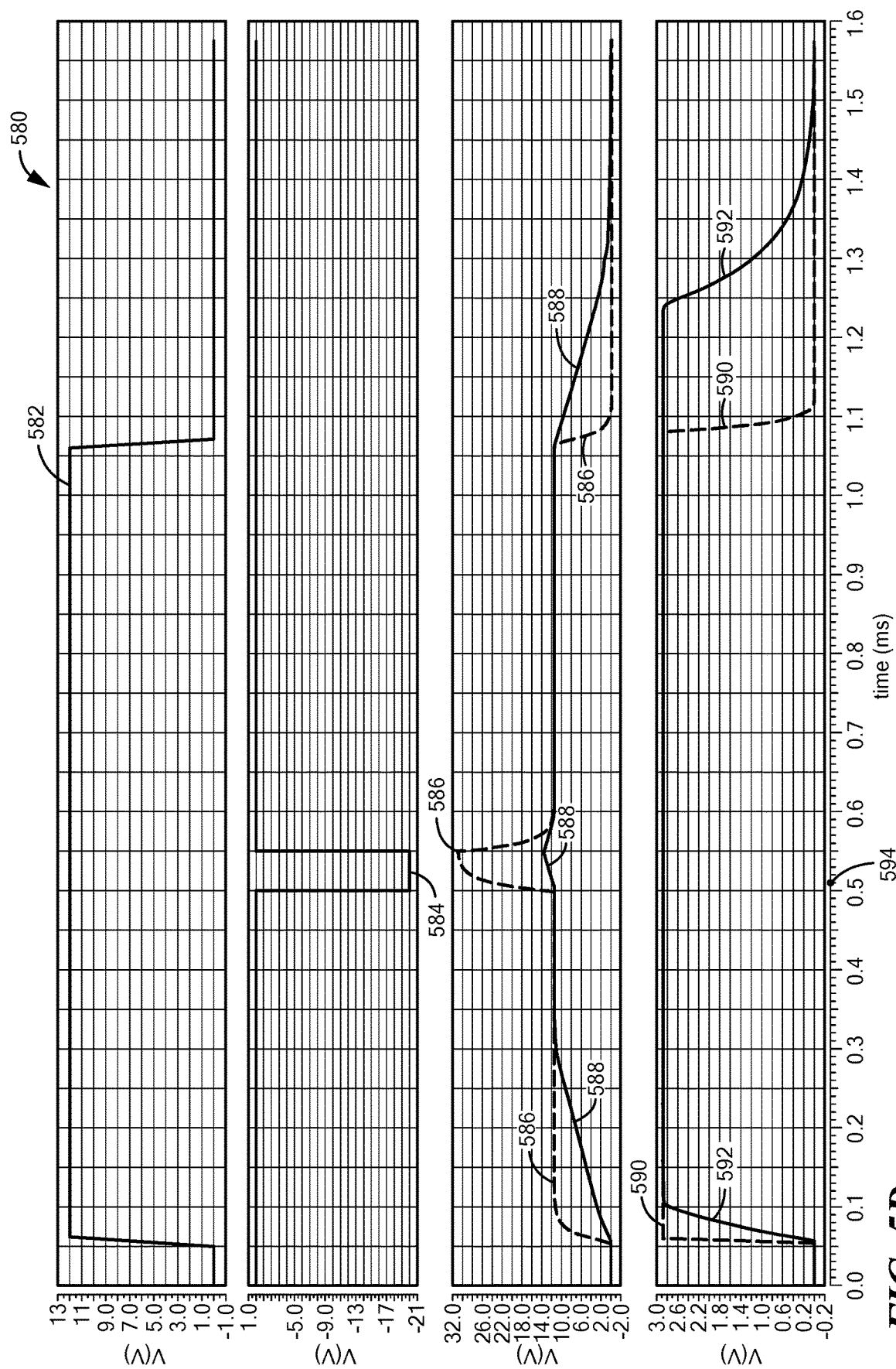
FIG. 5D shows a plot comparing responses of a sensor integrated circuit containing the current control circuit of FIG. 4 to a response of a sensor integrated circuit not containing the current control circuit of FIG. 4 during a negative voltage spike event at the ground terminal of the respective sensor integrated circuits.

Now referring to FIG. 5D, a plot 580 illustrates responses of an IC having a resistor coupled to an energy storage device to dissipate supply voltage transient energy to the response of an IC having a bidirectional current mirror coupled to an energy storage device such as that shown in FIG. 4 during a negative voltage spike at a ground pin (or ground terminal) of the respective ICs. For example, waveform 586 corresponds to the voltage across an energy storage device of an IC having a resistor coupled to the energy storage device and waveform 590 corresponds to the voltage at the internal regulator. Waveform 588 corresponds to the voltage across an energy storage device of an IC having a bidirectional current mirror coupled to the energy storage device and waveform 592 corresponds to the voltage at the internal regulator.

In plot 580, a positive supply voltage 582 (e.g., Vcc) is provided to a power pin of the IC from an external power supply and ground voltage 584 (e.g., Vgnd) represents the voltage level at a ground pin of the IC. At a time 594, a negative spike occurs at the ground pin resulting in a negative spike in ground voltage 584. In response to the negative spike on the ground voltage 584, waveform 586 increases in a corresponding opposite fashion (e.g., by the same or similar but opposite voltage value) to the negative voltage spike resulting in a positive voltage spike on waveform 586, the voltage across the energy storage device. However, waveform 588 experiences a small change in value in response to the negative voltage spike.

Waveforms 590 and 592 experiences no change or a minimal change in value in response to the negative voltage spike. Thus, and as illustrated in FIG. 5D, the bidirectional current mirror can limit the current into the energy storage device and the voltage to an internal node within the IC and/or additional circuitry within the IC during an event such as a negative voltage spike at the ground pin of the IC.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A sensor integrated circuit having a power pin for coupling to an external power supply, a reference pin, and a functional circuit, comprising:
    an energy storage device;
    a current mirror comprising at least one MOSFET device and having a current path in series between the power pin and the energy storage device and configured to control a current flow to the energy storage device and a current flow from the energy storage device, wherein the current mirror is further configured to decouple the energy storage device from the power pin; and
    a gate drive circuit coupled to a gate terminal of the MOSFET device and comprising:
        at least one switch configured to be in a first state to turn off the MOSFET device or in a second state to turn on the MOSFET device; and
        a comparison device having a first input configured to receive a voltage associated with the power pin and a second input configured to receive a voltage associated with the energy storage device, wherein the at least one switch is controlled by an output of the comparison device.

2. The sensor integrated circuit of claim 1, wherein the current mirror comprises a pair of PMOS devices having a common gate connection and a common source connection.

3. The sensor integrated circuit of claim 1, wherein the current path comprises a first current path and wherein the current mirror further comprises a second current path configured to establish a current to be mirrored through the MOSFET device when the at least one switch is in the second state.

4. The sensor integrated circuit of claim 1, wherein the output of the comparison device causes the at least one switch to turn off the MOSFET device when the voltage at the power pin is less than the voltage associated with the energy storage device.

5. The sensor integrated circuit of claim 1, wherein the output of the comparison device causes the at least one switch to turn on the MOSFET device and to conduct a mirrored current associated with the second current path when the voltage at the power pin is greater than or equal to the voltage associated with the energy storage device.

6. A sensor integrated circuit having a power pin for coupling to an external power supply, a reference pin, and a functional circuit, comprising:

energy storing means;

means for controlling current having a current path in series between the power pin and the energy storage means, the means for controlling current configured to control a current flow to the energy storage means and a current flow from the energy storage means, wherein the means for controlling current is further configured to decouple the energy storage means from the power pin, wherein the means for controlling current comprises at least one MOSFET device; and a current generating means coupled to a gate terminal of the MOSFET device and comprising:

at least one switching means configured to be in a first state to turn off the MOSFET device or in a second state to turn on the MOSFET device; and means for comparing having a first input configured to receive a voltage associated with the power pin and a second input configured to receive a voltage associated with the energy storage device, wherein the at least one switching means is controlled by an output of the means for comparing.

7. The sensor integrated circuit of claim 6, wherein the means for controlling current comprises a pair of PMOS devices having a common gate connection and a common source connection.

8. The sensor integrated circuit of claim 6, wherein the current path comprises a first current path and wherein the current generating means further comprises a second current path configured to establish a current to be mirrored through the MOSFET device when the at least one switching means is in the second state.

9. The sensor integrated circuit of claim 6, wherein the output of the means for comparing causes the at least one switching means to turn off the MOSFET device when the voltage at the power pin is less than the voltage associated with the energy storage device.

10. The sensor integrated circuit of claim 6, wherein the output of the means for comparing causes the at least one switching means to turn on the MOSFET device and to conduct a mirrored current associated with the second current path when the voltage at the power pin is greater than or equal to the voltage associated with the energy storing means.

* * * * *

UNITED STATES PATENT AND TRADEMARK OFFICE
CERTIFICATE OF CORRECTION

PATENT NO. : 10,978,897 B2
APPLICATION NO. : 15/942968
DATED : April 13, 2021
INVENTOR(S) : Sam Tran It is certified that error appears in the above-identified patent and that said Letters Patent is hereby corrected as shown below:

In the Specification

Column 6, Line 61 delete "pine" and replace with --pin--.

Column 7, Line 59 delete "block" and replace with --blocking--.

Column 8, Line 13 delete "block" and replace with --blocking--.

Column 8, Line 29 delete "as not" and replace with --as but not--.

Column 10, Lines 2-3 delete "associated current" and replace with --associated with current--.

Column 10, Line 25 delete "response the" and replace with --response to the--.

Column 11, Line 51 delete "can be can be" and replace with --can be--.

Column 14, Lines 37-38 delete "into energy" and replace with --into the energy--.

Column 14, Line 42 delete "540 *c*" and replace with --540--.

Column 15, Line 50 delete "IC to and" and replace with --IC and--.

Column 16, Line 14 delete "experiences" and replace with --experience--.

Signed and Sealed this
Twenty-fourth Day of May, 2022

Katherine Kelly Vidal
*Director of the United States Patent and Trademark Office*